(12) United States Patent
Yoshioka et al.

(10) Patent No.: US 11,496,095 B2
(45) Date of Patent: Nov. 8, 2022

(54) OSCILLATOR (71) Applicant: CANON KABUSHIKI KAISHA, Tokyo (JP)

(72) Inventors: Toshifumi Yoshioka, Kanagawa (JP); Yasushi Koyama, Kanagawa (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 17/510,152

(22) Filed: Oct. 25, 2021

(65) Prior Publication Data

US 2022/0140788 A1  May 5, 2022

(30) Foreign Application Priority Data

Oct. 29, 2020  (JP) .............................. JP2020-181147

(51) Int. Cl.
| | |
|---|---|
| H03B 7/14 | (2006.01) |
| H01L 29/88 | (2006.01) |
| H03B 7/08 | (2006.01) |
| H01L 29/205 | (2006.01) |
| H01L 29/15 | (2006.01) |
| H01L 29/34 | (2006.01) |
| H01L 23/66 | (2006.01) |

(52) U.S. Cl.
CPC .............. *H03B 7/14* (2013.01); *H01L 23/66* (2013.01); *H01L 29/155* (2013.01); *H01L 29/205* (2013.01); *H01L 29/34* (2013.01); *H01L 29/882* (2013.01); *H03B 7/08* (2013.01); *H03B 2200/0084* (2013.01)

(58) Field of Classification Search
CPC .... H03B 7/08; H03B 2200/0084; H03B 7/14; H01L 29/882; H01L 29/34; H01L 29/205; H01L 29/155; H01L 29/0657; H01L 23/66
USPC ................................ 331/107 T, 96; 333/213
See application file for complete search history.

(56) References Cited

U.S. PATENT DOCUMENTS

2020/0111929 A1* 4/2020 Koyama ............... H01L 31/101

FOREIGN PATENT DOCUMENTS

JP          2014199965 A     10/2014

* cited by examiner

Primary Examiner — Arnold M Kinkead
(74) Attorney, Agent, or Firm — Canon U.S.A., Inc. IP Division (57) ABSTRACT An oscillator oscillating a tera hertz wave includes a negative resistive element including a first semiconductor layer, a second semiconductor layer, and an active layer disposed between the first semiconductor layer and the second semiconductor layer, with a first conductor, a second conductor, and a dielectric disposed between the first conductor and the second conductor constitutes a resonator, wherein the negative resistive element is disposed between the first conductor and the second conductor, and a layer with a higher resistivity than the first semiconductor layer or the second semiconductor layer, or an amorphous layer is disposed between the negative resistive element and the dielectric.

18 Claims, 7 Drawing Sheets

Prior Art

FIG. 9B

Prior Art

OSCILLATOR

BACKGROUND

Field of the Disclosure

The present disclosure relates to an oscillator for a high frequency electromagnetic wave (called a tera hertz wave in this Specification) in an arbitrary frequency band within a range from a millimeter wave band to a tera hertz wave band (namely 30 GHz or higher and 30 THz or lower).

Description of the Related Art

In the tera hertz wave band, there are absorption peaks derived from structures and states of many organic molecules included in biomaterials, pharmaceuticals, electronic materials, and so on. The tera hertz wave has high transmissivity for materials such as paper, ceramics, resins, and cloths. Research and development of imaging techniques and sensing techniques utilizing the above-mentioned features of the tera hertz wave have been carried out in recent years. For example, applications to a fluoroscopy apparatus to be substituted for an X-ray apparatus and an in-line nondestructive inspection apparatus in a manufacturing process are expected.

As oscillator including a resonator integrated on a negative resistive element is well known as a current injection type oscillator generating the electromagnetic wave in the above-mentioned frequency band.

Japanese Patent Laid-Open No. 2014-199965 discloses a tera hertz wave oscillator in which a negative resistive element formed by an RTD (Resonant Tunneling Diode) and a microstrip resonator are integrated on the same substrate.

It is known that the oscillator using the negative resistive element causes a parasitic oscillation attributable to a bias circuit for adjusting a bias voltage of the negative resistive element, the bias circuit including a power supply and a wiring. The parasitic oscillation is a spurious oscillation parasitically generated in a frequency band on a lower frequency side different from a desired frequency and reduces an oscillation output at the desired frequency.

Figure 9A:
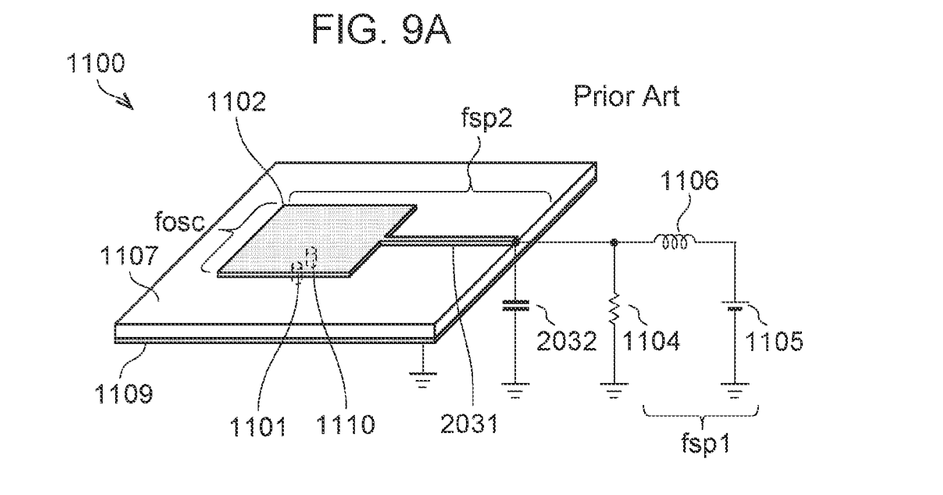
FIGS. 9A and 9B are explanatory views illustrating a configuration of an oscillator disclosed in Japanese Patent Laid-Open No. 2014-199965.
Figure 9B:
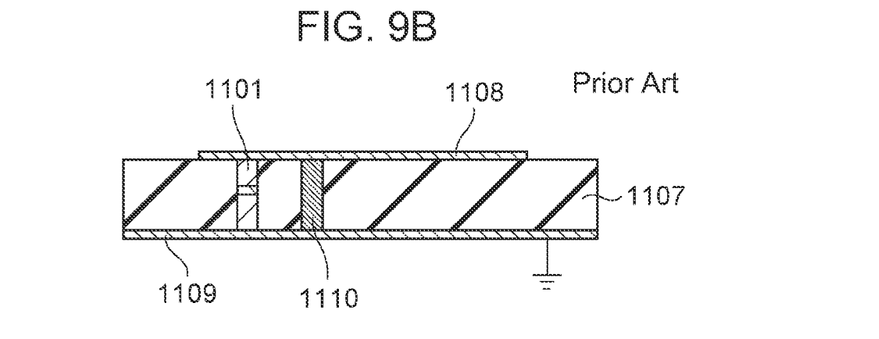

Japanese Patent Laid-Open No, 2014-199965 proposes a configuration for suppressing the parasitic oscillation. FIGS. 9A and 9B illustrate the configuration proposed in Japanese Patent Laid-Open No. 2014-199965.

FIG. 9A is a perspective view illustrating an external appearance of an oscillator 1100, and FIG. 9B is a sectional view of the oscillator 1100.

The oscillator 1100 is a microstrip resonator including the patch antenna 1102 in which a negative resistive element 1101 and a dielectric 1107 are sandwiched between two conductors 1108 and 1109, A resonance frequency is fosc.

The bias circuit for adjusting a bias voltage of the negative resistive element 1101 is constituted by a power supply 1105 and a wiring 1106. Because the wiring 1106 inevitably accompanies with a parasitic inductance component, it is indicated as an inductance. A strip conductor 2031 supplies a bias to the negative resistive element 1101 from the bias circuit. A resistance 1104 and a capacitor 2032 connected in parallel to the resistance 1104 form a low impedance circuit. Those components suppress a parasitic oscillation at a relatively low frequency fsp1 (fsp1<fosc, typically in a frequency band from DC to 10 GHz), which is attributable to the bias circuit including the power supply 1105, the wiring 1106, and so on.

Furthermore, in FIGS. 9A and 9B, a resistive element 1110 arranged in parallel to the negative resistive element 1101 is disposed in the patch antenna 1102. An inductance of the strip conductor 2031 and a capacitance of the patch antenna 1102 produce an LC resonance at a frequency fsp2 (fsp2<fosc). The frequency fsp2 is determined depending on a length of the strip conductor 2031 and an area of the patch antenna 1102 and is typically in a range of 10 to 500 GHz. The resistive element 1110 is arranged at the substantial node of an electric field at the oscillation frequency fosc. Thus, the vicinity of the desired oscillation frequency fosc exhibits a high impedance, and the vicinity of the frequency fsp2 (fsp2<fosc) of the parasitic oscillation exhibits a low impedance. Hence the parasitic oscillation caused by the wiring structure can be suppressed.

Meanwhile, in a system using an alternating current, it is generally known that harmonics with frequencies of integral multiples of a basic frequency, namely the frequency of a basic wave, generate attributable to a power supply and electronic equipment.

The oscillator using the negative resistive element also similarly generates harmonics with frequency components of integral multiples of the desired oscillation frequency fosc in many cases and accompanies with a problem that the oscillation output at the desired oscillation frequency fosc is reduced due to the generation of the harmonics.

The above-cited Japanese Patent Laid-Open No. 2014-199965 does not pay consideration to oscillations of harmonics at frequencies fhr (fhr>fosc) higher than the desired oscillation frequency fosc and has a problem that the unwanted harmonics cannot be suppressed.

SUMMARY

The present disclosure provides an oscillator oscillating a tera hertz wave, the oscillator including a negative resistive element including a first semiconductor layer, a second semiconductor layer, and an active layer disposed between the first semiconductor layer and the second semiconductor layer, and a resonator including a first conductor, a second conductor, and a dielectric disposed between the first conductor and the second conductor, wherein the negative resistive element is disposed between the first conductor and the second conductor, a layer is disposed between the negative resistive element and the dielectric, and the layer is a layer with a higher resistivity than the first semiconductor layer or the second semiconductor layer.

The present disclosure further provides an oscillator oscillating a tera hertz wave, the oscillator including a negative resistive element including a first semiconductor layer, a second semiconductor layer, and an active layer disposed between the first semiconductor layer and the second semiconductor layer, and a resonator including a first conductor, a second conductor, and a dielectric disposed between the first conductor and the second conductor, wherein the negative resistive element is disposed between the first conductor and the second conductor, a layer is disposed between the negative resistive element and the dielectric, and the layer is an amorphous layer.

Further features of the present disclosure will become apparent from the following description of exemplary embodiments with reference to the attached drawings.

DESCRIPTION OF THE EMBODIMENTS

First Embodiment

The present disclosure intends to suppress oscillations at unwanted frequencies higher than a desired oscillation frequency in a microstrip resonator such as a patch antenna, and to provide an oscillator capable of stably oscillating at the desired oscillation frequency in a tera hertz band.

Figure 1A:
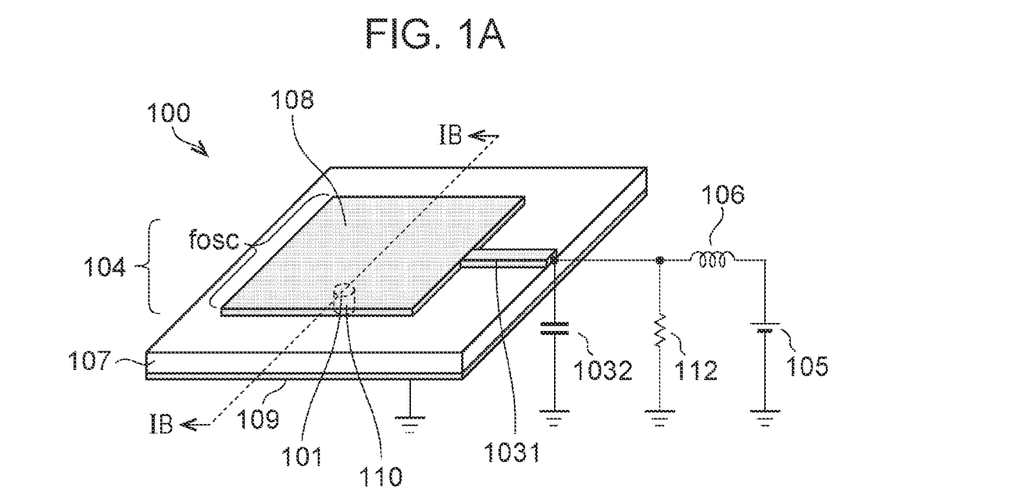
FIGS. 1A and 1B are explanatory views illustrating a configuration of an oscillator according to a first embodiment of the present disclosure.
Figure 1B:
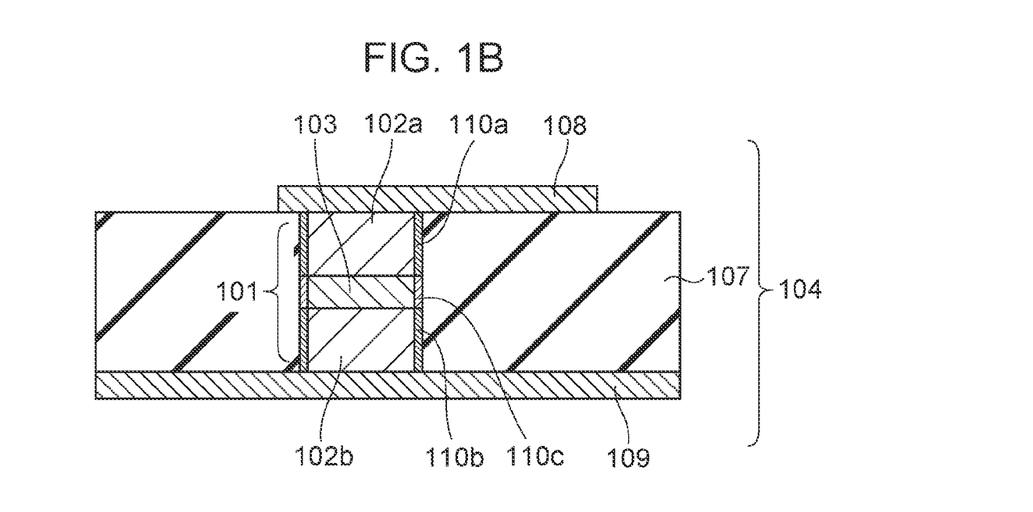

An oscillator 100 according to a first embodiment will be described below with reference to FIGS. 1A and 1B. FIGS. 1A and 1B are schematic views illustrating the oscillator 100 according to the first embodiment of the present disclosure. More specifically, FIG. 1A is a perspective view illustrating an external appearance, and FIG. 1B is a sectional view taken along IB-IB in FIG. 1A.

The oscillator 100 according to the first embodiment of the present disclosure is a microstrip resonator in which a negative resistive element 101 and a dielectric 107 are sandwiched between a conductor 108 (first conductor) and a conductor 109 (second conductor). The negative resistive element 101 is disposed between the conductor 108 (first conductor) and the conductor 109 (second conductor).

The negative resistive element 101 has a mesa structure forming a trapezoidal, rectangular, or circular shape in a plan view. In this embodiment, as illustrated in FIG. 1A, the negative resistive element 101 has the mesa structure with a circular cross-sectional shape. The negative resistive element 101 is constituted by low-resistance semiconductor layers 102a and 102b formed by doping, for example, and an active layer 103 providing a gain. In other words, in the negative resistive element 101, the low-resistance semiconductor layer 102a (first semiconductor layer), the active layer 103, and the low-resistance semiconductor layer 102b (second semiconductor layer) are laminated in a first direction.

A layer 110 with a higher resistivity than the low-resistance semiconductor layers (doping layers) 102a and 102b is formed on a side wall of the negative resistive element 101. In this embodiment, the layer 110 is divided into a layer 110a forming a side wall of the doping layer 102a, a layer 110b forming a side wall of the doping layer 102b, and a layer 110c forming a side wall of the active layer 103.

The layers 110a, 110b, and 110c have a higher resistivity than the doping layers 102a and 102b. More specifically, the resistivity of the layers 110a, 110b, and 110c is 10 times or more and 10000 times or less that of the doping layers. For example, the resistivity of those three layers is 100 times or more and 1000 times or less.

The layers 110a, 110b, and 110c are amorphous layers 110a, 110b, and 110c that are formed as layers in an amorphous state by performing processing on the negative resistive element 101 after forming the negative resistive element 101 into a mesa shape.

Here, although the term "amorphous" indicates a state not exhibiting clear crystallinity, the above-mentioned layer may contain a very fine crystal in its part. More specifically, when there are no diffraction peaks representing crystallinity in an X-ray diffraction spectrum (XRD) or electron-beam diffraction measurement with TEM observation, the target layer can be regarded as being amorphous. Even if there are diffraction peaks, the target layer can be regarded as being amorphous when the peaks are a few. Moreover, when there is a halo peak, the target layer can be regarded as being amorphous.

The negative resistive element 101 including the active layer 103 is an element with a current-voltage characteristic in which a region where a current reduces as a voltage increases, namely a region where the element exhibits negative resistance, appears. Typically, the negative resistive element 101 is preferably constituted by a high frequency element such as a resonance tunneling diode (RTD), an Esaki diode, a Gunn diode, or a transistor of which one terminal is terminated. As another example, a TUNNET diode, an INPATT diode, a heterojunction bipolar transistor (HBT), a compound semiconductor FET, or a high electron mobility transistor (HEMT) may also be used. Furthermore, the negative resistance of a Josephson element using a superconductor may be utilized.

The following description is made in connection with an example in which the RTD, namely a typical negative resistive element operating in a tera hertz band, is used as the negative resistive element 101.

A patch antenna 104 is a resonator in a tera hertz band and is a microstrip resonator using a microstrip line with a finite length, and so on. The patch antenna 104 has a structure that the negative resistive element 101 and the dielectric 107 are sandwiched between two conductors, namely the conductors 108 and 109. The conductor 108 is an upper conductor of the patch antenna 104, and the conductor 109 is a grounding conductor of the patch antenna 104.

Here, the term "dielectric" indicates a substance in which a dielectric property is more dominant than conductivity, specifically a material behaving as an insulator or a high resistance body that does not allow or is hard to allow electricity to pass therethrough for a DC current. Typically, a material with a resistivity of 1 kΩm or more is preferable. Practical examples of such a material are plastic, ceramic, silicon oxide, silicon nitride, and silicon oxynitride.

In the patch antenna 104, a width of the conductor 108 in a direction denoted by IB-IB is set to constitute a λ/2 resonator. The patch antenna 104 is an active antenna including the negative resistive element 101 integrated therein. Accordingly, an oscillation frequency lose defined by the patch antenna 104 of the oscillator 100 is determined as a resonance frequency of an entire parallel resonance circuit in combination of the patch antenna 104 and a reactance of the negative resistive element 101. In more detail, according to the disclosure of Jpn. J. Appl. Phys., Vol. 47, No. 6(2008), a frequency satisfying the following condition in combination of an admittance (YRTD) of the RTD and an admittance (YANT) of the antenna is given as the oscillation frequency fosc. The following formula (1) represents an amplitude condition, and the following formula (2) represents a phase condition.

Amplitude condition Re[YRTD]+Re[YANT]<=0 (1)

Phase condition Im[YRTD]+Im[YANT]=0 (2)

Here, Re[YRTD] denotes the admittance of the negative resistive element and is a negative value.

A bias circuit for adjusting a bias voltage of the negative resistive element 101 is constituted by a power supply 105 and a wiring 106. Because the wiring inevitably accompanies with a parasitic inductance component, it is indicated as an inductance in FIG. 1A. The power supply 105 supplies a current necessary for driving the negative resistive element 101 and adjusts the bias voltage. The bias voltage is typically selected from a negative resistance region of the negative resistive element 101. A strip conductor 1031 has the role of supplying a bias to the negative resistive element 101 from the power supply 105 and the wiring 106 therethrough.

A resistance 112 and a capacitor 1032 connected in parallel to the resistance 112 form a low impedance circuit. This low impedance circuit suppresses a parasitic oscillation at a relatively low frequency, which is attributable to the bias circuit including the power supply 105, the wiring 106, and so on.

It is known that, when a high frequency current flows through a conductor, a larger current flows in a region closer to a surface of the conductor due to the skin effect, and the current is more concentrated on the surface at a higher frequency.

Here, when a depth d at which the current is given by 1/e of the current flowing along the surface of the conductor is called a skin depth, d is expressed by the following formula (3) on an assumption of an electric resistivity: ρ, a permeability: μ, and an angular frequency: ω.

$$d=\sqrt{(2\rho/\omega\mu)}$$ (3)

The skin depth d reduces as the angular frequency ω increases, and the current passes through only the region closer to the surface as the angular frequency ω increases.

Because the reduction in the skin depth d reduces an area through which the current passes, an effective resistance value increases at a higher frequency. An approximate value of the skin depth in the tera hertz band is given, for example, as follows. When a high frequency current flows through a low-resistance semiconductor layer with the resistivity of $3\times10^{-7}$ Ωm, the skin depth is about 260 nm at 1 THz and is about 160 nm at 2 THz.

Also in driving of the mesa-shaped negative resistive element 101 oscillating the tera hertz wave, a larger current flows through a region closer to the surface of the mesa shape at a higher frequency due to the skin effect and the effective resistance value increases.

In the oscillator 100 according to this embodiment, as described above, the amorphous layers 110a and 110b are formed on the side walls of the doping layers 102a and 102b, respectively. With such a configuration, in the oscillation circuit including the negative resistive element 101, a loss generates due to a combined resistance of the doping layers 102a and 102b and the amorphous layers 110a and 110b. Furthermore, because a larger current passes through the region closer to the mesa shape at a higher frequency due to the skin effect, the effective resistance value increases and the loss also increases under greater influences of the amorphous layers 110a and 110b both formed on a surface side. Accordingly, a second harmonic wave and a third harmonic wave at higher frequencies than the oscillation frequency fosc of the oscillator 100 are affected by the amorphous layers 110 to a larger extent and undergo greater losses. Hence oscillations of the unwanted harmonics can be suppressed. In other words, the amorphous layers 110a and 110b can give effective losses to the unwanted harmonics at positions very close to the negative resistive element 101, namely at the side wall of the negative resistive element 101 inside the patch antenna 104.

The resistivity of the amorphous layers 110a and 110b can be set as appropriate depending on a required value of the oscillation frequency fosc, the structure of the negative resistive element 101, and so on such that a loss at the oscillation frequency fosc of the oscillator 100 is held small and the effective losses are given to the second and third harmonics. Components of the amorphous layers 110a and 110b are mainly provided by elements forming the doping layers 102a and 102b, elements needed in an amorphization step, and so on. For example, InGaAs, InAlAs, n-InGaAs, Si, O, N, C, and F may be used.

A thickness of the amorphous layers 110a and 110b is set as appropriate depending on the required value of the oscillation frequency fosc, the structure of the negative resistive element 101, and so on, but it is suitably in a range of about 1 nm or more and about 500 nm or less. A more suitable numerical range is 5 nm or more and 200 nm or less.

Here, the term "thickness (film thickness)" indicates a thickness (film thickness) in a direction (second direction) orthogonal to a direction (first direction) in which the layers forming the negative resistive element 101 are laminated.

Furthermore, as described above, the amorphous layer 110c is formed on the side wall of the active layer 103. Components of the amorphous layer 110c on the side wall of the active layer 103 are mainly provided by components forming the active layer 103, components needed in the amorphization step, and so on. For example, AlAs, InGaAs, InAlAs, those threes being undoped without being subjected to carrier doping, O, N, C. and F may be used. A thickness of the amorphous layer 110c is set as appropriate depending on the required value of the oscillation frequency fosc, the structure of the negative resistive element 101, and so on, but it is suitably in a range of about 1 nm or more and about 500 nm or less. A more suitable numerical range is 5 nm or more and 200 nm or less.

The amorphous layer 110c on the side wall of the active layer 103 has a higher resistivity than the doping layers 102a and 102b and has a lower impedance than the active layer 103, which is an undoped semiconductor, due to the amorphization. Therefore, a leakage current through a capacitance of the active layer 103 increases and a dielectric loss tangent (tan δ) increases, Here, it is known that, when an AC electric field is applied to a dielectric, a power loss (dielectric loss) generates, and the dielectric loss is in proportion to a frequency and the dielectric loss tangent (tan δ). Accordingly, the dielectric losses of the second harmonic wave and the third harmonic wave at higher frequencies than the oscillation frequency fosc of the oscillator 100 are further increased, and this is effective in suppressing the oscillations of the unwanted harmonics.

Second Embodiment

Figure 2A:
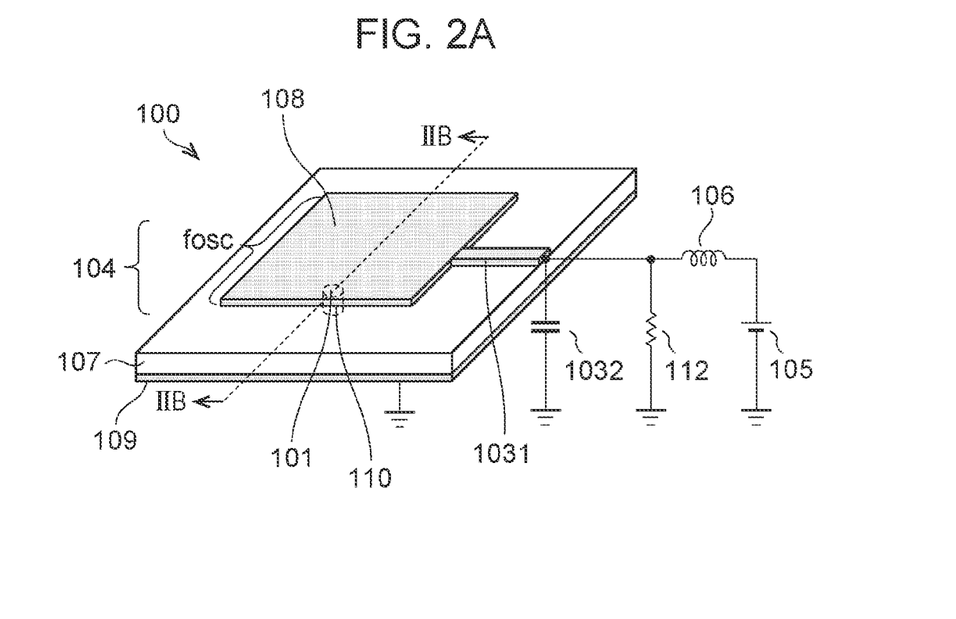
FIGS. 2A and 2B are explanatory views illustrating a configuration of an oscillator according to a second embodiment of the present disclosure.
Figure 2B:
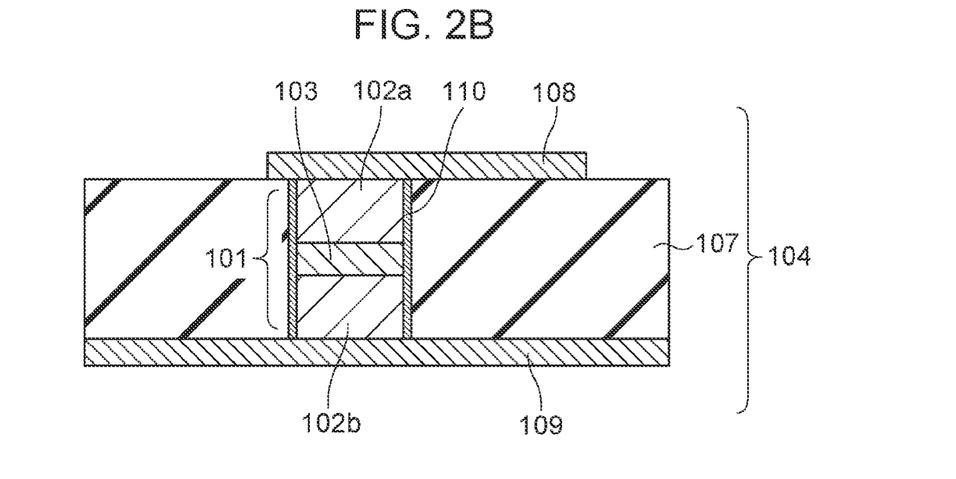

FIGS. 2A and 2B are schematic views illustrating an oscillator 100 according to a second embodiment of the present disclosure. More specifically, FIG. 2A is a perspective view illustrating an external appearance, and FIG. 2B is a sectional view taken along IIB-IIB in FIG. 2A.

In FIGS. 2A and 2B, a negative resistive element 101 includes low-resistance semiconductor layers (doping layers) 102a and 102b and an active layer 103. Description of the same structure as that in the first embodiment is omitted.

A layer 110 is formed on a side wall of the negative resistive element 101. The layer 110 in the second embodiment is obtained by forming a resistive film with a desire resistivity after forming the negative resistive element 101 in a mesa shape. Components of the resistive film and a method of forming the resistive film are selected as appropriate. More specifically, the resistive film can be formed in a manner of reacting, for example, Si, O, N, P or S with a low-resistance material, such as Al, Ti or C, to provide the desired resistivity by a CVD method, a sputtering method, or a vapor deposition method, for example. The layer 110 may be made of, for example, aluminum oxide, titanium oxide, silicon carbide, nitride such as silicon nitride, titanium nitride, or aluminum nitride, or another compound such as a sulfur-based compound or a fluorine-based compound.

With the above-described configuration, a loss is generated due to a combined resistance of the doping layers 102a and 102b and the layer 110. Because a larger current flows through a region closer to a surface of the mesa shape at a higher frequency due to the skin effect, a resistance in that region increases and the loss also increases under a greater influence of the layer 110 formed on a surface side. Accordingly, a second harmonic wave and a third harmonic wave at higher frequencies than the oscillation frequency fosc of the oscillator 100 undergo greater losses with the presence of the amorphous layer 110. Hence the oscillation of the unwanted harmonics can be suppressed.

Third Embodiment

Figure 3:
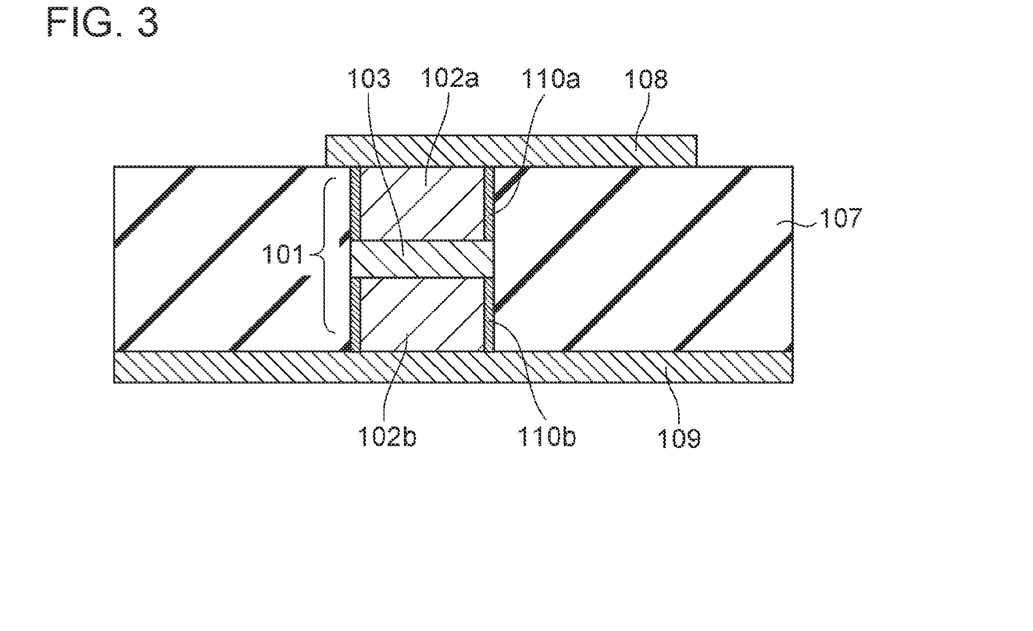
FIG. 3 is an explanatory view illustrating a configuration of an oscillator according to a third embodiment of the present disclosure.

FIG. 3 is a schematic view illustrating an oscillator 100 according to a third embodiment of the present disclosure and is a schematic sectional view (corresponding to FIG. 1B) illustrating the surrounding of a negative resistive element 101. Description of the same structure as that in the first embodiment is omitted.

In FIG. 3, layers (amorphous layers) 110a and 110b are formed on side walls of low-resistance semiconductor layers (doping layers) 102a and 102b of the negative resistive element 101, respectively. The amorphous layers 110a and 110b have a higher resistivity than the doping layers 102a and 102b. With such a configuration as well, losses of a second harmonic wave and a third harmonic wave at higher frequencies than the oscillation frequency fosc of the oscillator 100 are increased and hence oscillation of the unwanted harmonics can be suppressed as in the above-described embodiments.

Here, a current path with respect to an active layer 103 is formed in a combination of the doping layer 102a and the amorphous layer 110a on the side wall of the doping layer 102a and a combination of the doping layer 102b and the amorphous layer 110b on the side wall of the doping layer 102b. Therefore, at least part of the doping layer 102a and the amorphous layer 110a on the side wall of the doping layer 102a and at least part of the doping layer 102b and the amorphous layer 110b on the side wall of the doping layer 102b are just required to be electrically connected to the active layer 103. Accordingly, an end position of a side wall of the active layer 103 and end positions of the amorphous layers 110a and 110b can be optionally set to provide desired shapes.

Fourth Embodiment

Figures 4A, 4B:
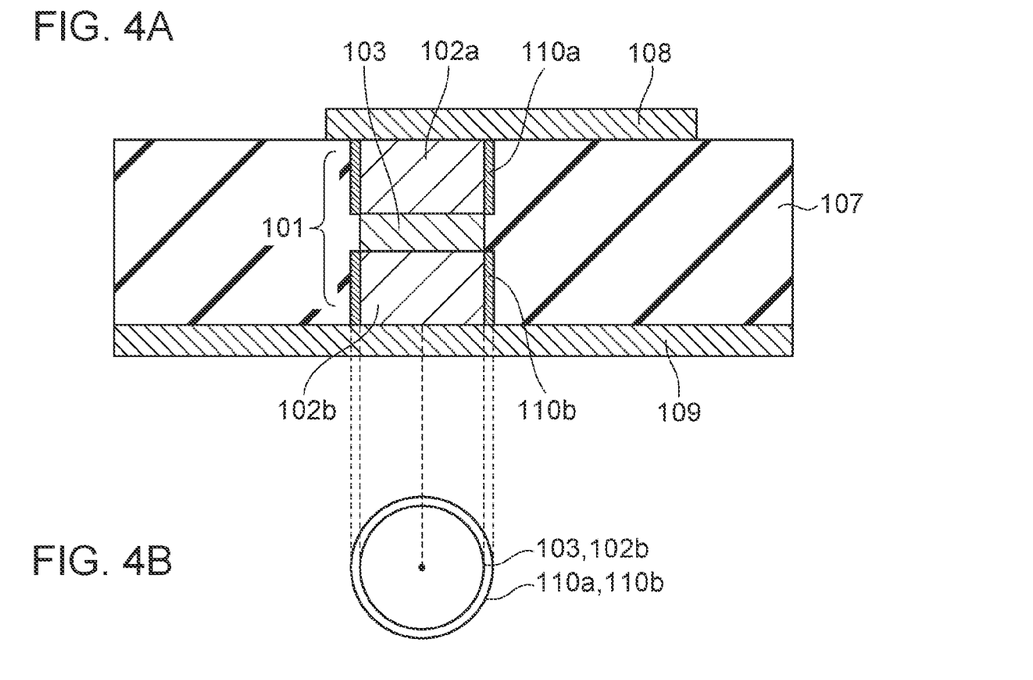
FIGS. 4A and 4B are each an explanatory view illustrating a configuration of an oscillator according to a fourth embodiment of the present disclosure.

FIG. 4A is a schematic view illustrating an oscillator 100 according to a fourth embodiment of the present disclosure and is a schematic sectional view (corresponding to FIG. 1B) illustrating the surrounding of a negative resistive element 101. Description of the same structure as that in the first embodiment is omitted.

In FIG. 4A, amorphous layers 110a and 110b are formed on side walls of doping layers 102a and 102b of the negative resistive element 101, respectively. A side wall of an active layer 103 is positioned closer to a center of a mesa structure than side walls of the amorphous layers 110a and 110b. FIG. 4B is a plan view and illustrates that an outer edge of the active layer 103 is positioned closer to the center of the mesa structure than outer edges of the amorphous layers 110a and 110b.

As in the above-described configuration, positions of the amorphous layers 110a and 110b and a position of the active layer 103 can be optionally set. Contrary to the arrangement of FIGS. 4A and 4B, the outer edges of the amorphous layers 110a and 110b may be positioned closer to the center of the mesa structure than the outer edge of the active layer 103.

Fifth Embodiment

Figure 5:
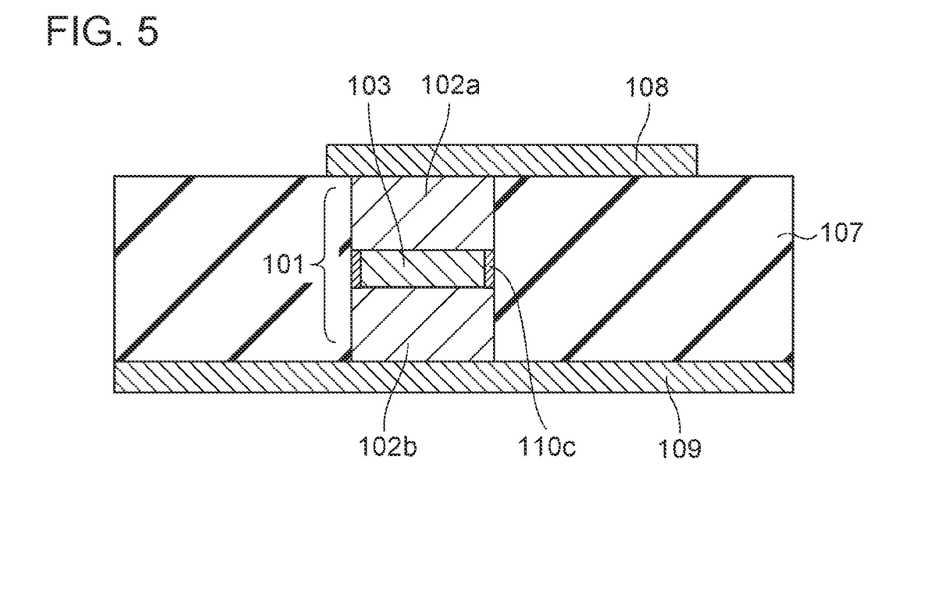
FIG. 5 is an explanatory view illustrating a configuration of an oscillator according to a fifth embodiment of the present disclosure.

FIG. 5 is a schematic view illustrating an oscillator 100 according to a fifth embodiment of the present disclosure and is a schematic sectional view (corresponding to FIG. 1B) illustrating the surrounding of a negative resistive element 101. Description of the same structure as that in the first embodiment is omitted.

In FIG. 5, an amorphous layer 110c is formed on a side wall of an active layer 103 of the negative resistive element 101. The amorphous layer 110c has a higher resistivity than doping layers 102a and 102b and has a lower impedance than the active layer 103.

Therefore, as described above, a leakage current through a capacitance of the active layer 103 increases and a dielectric loss tangent (tan δ) increases. Accordingly, dielectric losses of a second harmonic wave and a third harmonic wave at higher frequencies than the oscillation frequency fosc of the oscillator 100 are increased, and this is effective in suppressing oscillations of the unwanted harmonics.

Since the active layer 103 and the amorphous layer 110c are joined to each other, an outer edge position of the amorphous layer 110c and outer edge positions of the doping layers 102a and 102b electrically connected to the active layer 103 may be optionally set to provide desired shapes.

Sixth Embodiment

Figure 6A:
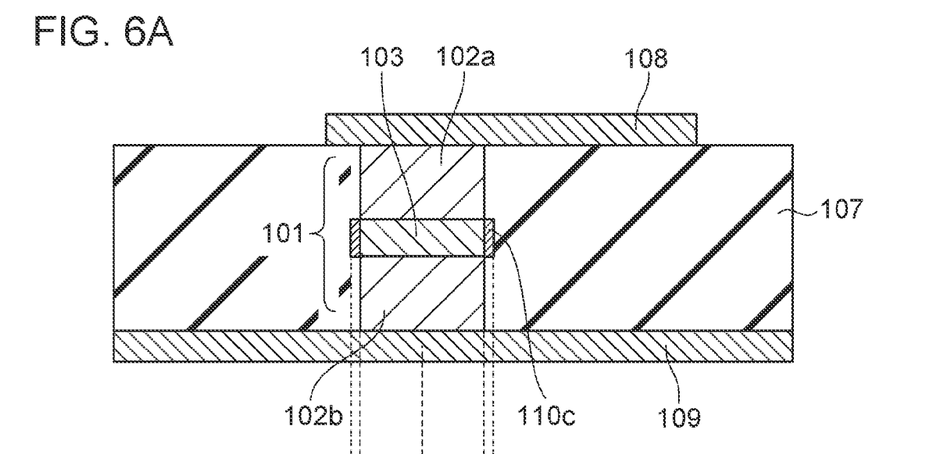
FIGS. 6A and 6B are each an explanatory view illustrating a configuration of an oscillator according to a sixth embodiment of the present disclosure.

FIG. 6A is a schematic view illustrating an oscillator 100 according to a sixth embodiment of the present disclosure and is a schematic sectional view (corresponding to FIG. 1B) illustrating the surrounding of a negative resistive element 101. Description of the same structure as that in the first embodiment is omitted.

In FIG. 6A, an amorphous layer 110c is formed on a side wall of an active layer 103 of the negative resistive element 101. In a plan view illustrated in FIG. 6B, outer edges of the doping layers 102a and 102b are positioned closer to the center of the mesa structure than an outer edge of the amorphous layer 110c.

Figure 6B:
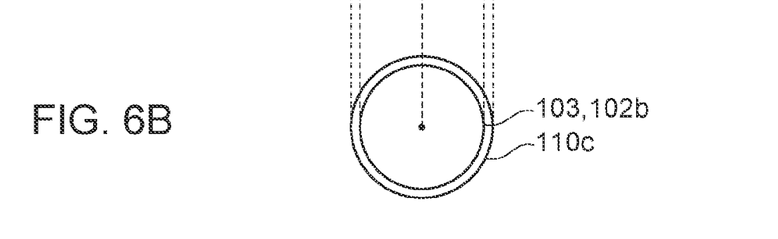

As described above, outer edge positions of the amorphous layer 110c and outer edge positions of the doping layers 102a and 102b can be optionally set. Thus, the outer edge of the amorphous layer 110c may be positioned closer to the center of the mesa structure than the outer edges of the doping layers 102a and 102b in the plan view.

Example 1

Figure 7A:
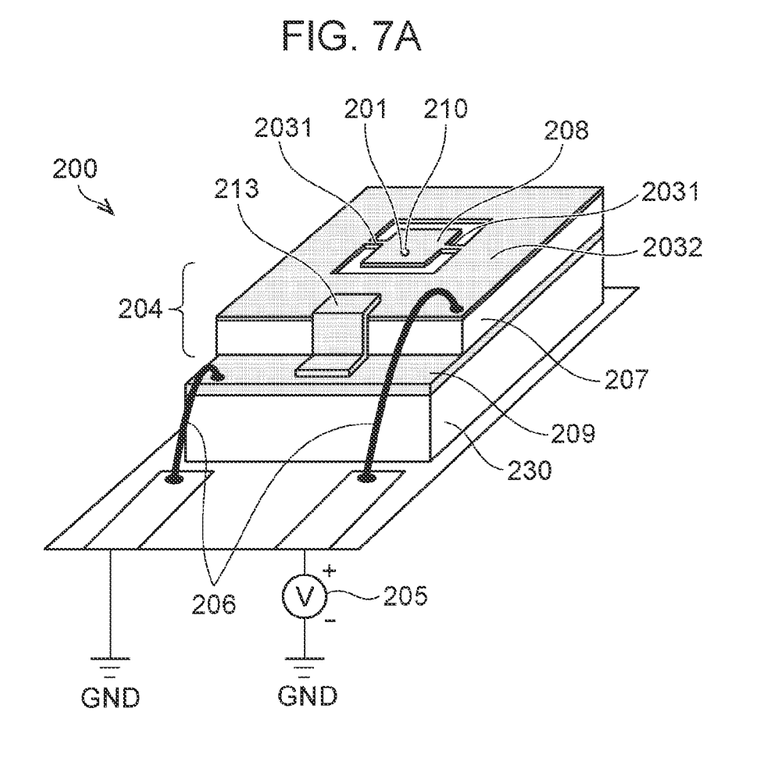
FIGS. 7A and 7B are explanatory views illustrating a configuration of an oscillator of EXAMPLE 1.
Figure 7B:
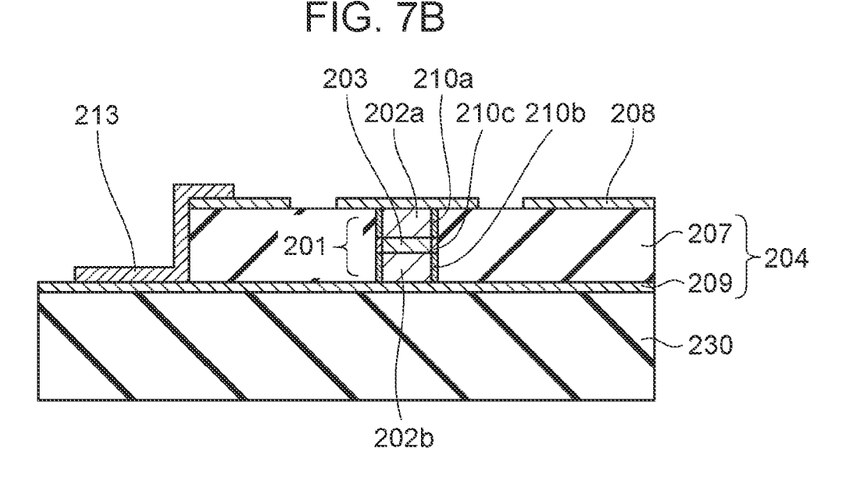

An oscillator 200 of EXAMPLE 1 will be described below with reference to FIGS. 7A (perspective view) and 7B (sectional view).

The oscillator 200 is an oscillator configured to oscillate at an oscillation frequency fosc=0.95 THz. In this EXAMPLE, a resonance tunneling diode (RTD) is used as a negative resistive element 201. In the RTD used in this EXAMPLE, for example, a multiple quantum well structure of InGaAs/InAlAs and InGaAs/AlAs is constituted, as an active layer 203, on an InP substrate 230. The active layer 203 includes, as doping layers 202a and 202b, electrical contact layers made of n-InGaAs and is constituted as the negative resistive element 201. For example, a triple barrier structure is used as the multiple quantum well structure. More specifically, the multiple quantum well structure is constituted as a semiconductor multilayer film structure of AlAs (1.3 nm)/InGaAs (7.6 nm)/InAlAs (2.6 nm)/InGaAs (5.6 nm)/AlAs (1.3 nm). Of the above-mentioned layers, InGaAs is a well layer, while lattice aligned InAlAs and non-aligned AlAs are barrier layers. Those layers are formed as undoped layers into which no carriers are intentionally doped. The active layer 203 formed in the above-described multiple quantum well structure is sandwiched between the electrical contact layers given by the doping layers 202a and 202b made of n-InGaAs with an electron concentration of $2\times10^{18}$ cm$^{-3}$, thus constituting the negative resistive element 201.

In a current-voltage I(V) characteristic of the above-mentioned structure between the electrical contact layers, a peak current density is 280 kA/cm$^2$ and a negative resistance region is given from about 0.7 V to about 0.9 V. When the RTD has the mesa structure with a diameter of about 2 μm, a peak current of 10 mA and a negative resistance of −20Ω are obtained.

A patch antenna 204 is a square patch including a conductor 208 with each side of 60 μm, and BCB (benzocyclobutene, made by Dow Chemical Company, εr=2.4) with a thickness of 3 μm is arranged as a dielectric 207 between the conductor 208 and a conductor 209 on a grounding side. The RTD 201 with the diameter of 2 μm is connected between the conductors 208 and 209 and is arranged at a position shifted from a center of the conductor 208 by 24 μm in a resonance direction. A resonance frequency of the patch antenna 204 alone is about 1.5 THz, but an oscillation frequency fosc of the oscillator 200 is about 0.95 THz in consideration of a reactance of the RTD constituting the negative resistive element 201.

The conductor 208 is connected to an MIM capacitor 2032 through two strip conductors 2031 each of which has a width of 5 μm and a length of 15 μm. The magnitude of a capacitance of the MIM capacitor 2032 is set to 10 pF in this EXAMPLE. Wire-bonded wirings 206 are connected to the MIM capacitor 2032, and a bias voltage of the negative resistive element 201 is adjusted by a power supply 205.

The negative resistive element 201 includes the doping layers 202a and 202b and the active layer 203. Amorphous layers 210a and 210b are formed on side walls of the doping layers 202a and 202b, respectively, and an amorphous layer 210c is formed on a side wall of the active layer 203.

The active layer 203 (RTD) in this EXAMPLE is formed in the mesa structure with the diameter of 2 μm, and the amorphous layers 210a, 210b, and 210c are formed around the active layer 203, each of the amorphous layers having a thickness of 140 nm.

Furthermore, a height of the mesa structure of the negative resistive element 201 is set to 200 nm.

The doping layers 202a and 202b have a resistivity of about $3\times10^{-7}$ Ωm. On the other hand, regarding a resistivity of the amorphous layers 210a and 210b, because conductivity of the amorphous layer is reduced due to deterioration of crystallinity and a reduction in dopant amount, the resistivity is estimated to increase by two to three orders of magnitude.

A combined resistance of the doping layers 202a and 202b and the amorphous layers 210a and 210b increases, as described above, due to the skin effect as the frequency increases. Thus, the combined resistance at the oscillation frequency fosc=0.95 THz is 0.1Ω or less, but it is estimated to be 2 to 4Ω at a second harmonic (1.9 THz) and 30 to 50Ω at a third harmonic (2.85 THz).

Furthermore, in the negative resistive element 201, the dielectric loss increases with the presence of the amorphous layer 210c on the side wall of the active layer 203, From the result of measurement in a millimeter band using an impedance analyzer, the dielectric loss tangent (tan δ) when the amorphous layer 210c is present on the side wall is estimated to be about 5 times that when the amorphous layer 210c is not present. Thus, losses of the second harmonic (1.9 THz) and the third harmonic are increased in comparison with a loss at the oscillation frequency fosc=0.95 THz, and the unwanted oscillations of the second and third harmonics can be suppressed.

The oscillator 200 of this EXAMPLE is fabricated as follows.

First, the following layers are epitaxially grown on the InP substrate 230 by, for example, a molecule beam epitaxy (MBE) or a metal organic vapor phase epitaxy (MOVPE). Specifically, n-InP/n-InGaAs, InGaAs/InAlAs, and n-InP/n-InGaAs are epitaxially grown in sequence to form a resonance tunneling diode (RID), namely the negative resistive element 201. When an n-type conductive substrate is selected as the InP substrate 230, the epitaxial growth is performed starting from n-InGaAs.

Then, the resonance tunneling diode 201 is etched to have a circular mesa shape with a diameter of 2.28 μm. Dry, etching with EB (electron beam) lithography and ICP (inductive coupling plasma) is used in the etching. Photolithography may be used instead.

Then, an amorphization process is performed on a side wall of the mesa-shaped resonance tunneling diode 201.

In the amorphization process, $O_2$ plasma is used to amorphize the side wall of the resonance tunneling diode 201 through a thickness of 140 nm from a surface side such that the diameter of the resonance tunneling diode 201 becomes 2 μm.

A dry process using plasma or Ar plasma can also be used instead of the $O_2$ plasma.

A film serving as a resistive film may be formed without the amorphization process. In such a case, the resistive film is formed after forming the resonance tunneling diode 201 in the mesa shape with the diameter of 2 μm.

Components of the resistive film and a method of forming the resistive film are selected as appropriate. More specifically, the resistive film can be formed in a manner of reacting, for example, Si, O, N, F, P or S with a low-resistance material, such as Al, Ti or C, to provide the desired resistivity by a CVD method, a sputtering method, or a vapor deposition method, for example.

Then, the grounding conductor 209 is formed on an etched surface by a lift-off method.

The grounding conductor 209 may be formed before the above-described amorphization process. Furthermore, a passivation film may be formed to protect the resonance tunneling diode and the amorphous layers on the sidewall thereof. Moreover, after burying the BCB, namely the dielectric 207, with use of a spin coating method and dry etching, the conductor 208 made of Ti/Pd/Au, the strip conductor 2031, and an upper electrode of the MIM capacitor 2032 are formed by the lift-off method.

Finally, a Bi pattern is formed by the lift-off method in a region where the resistor 213 is to be formed, and the grounding conductor and the upper electrode of the MIM capacitor are connected to each other, whereby the oscillator 200 of this EXAMPLE is completed.

Electric power can be applied to the oscillator 200 as appropriate from the power supply 205 and the wirings 206 through the strip conductors 2031 positioned in a central portion of the oscillator 200. Usually, by applying a bias voltage in the negative resistance region and supplying a bias current, the oscillator 200 operates as an oscillator.

Example 2

An oscillator 300 of EXAMPLE 2 will be described below with reference to FIGS. 8A and 8B.

Figure 8A:
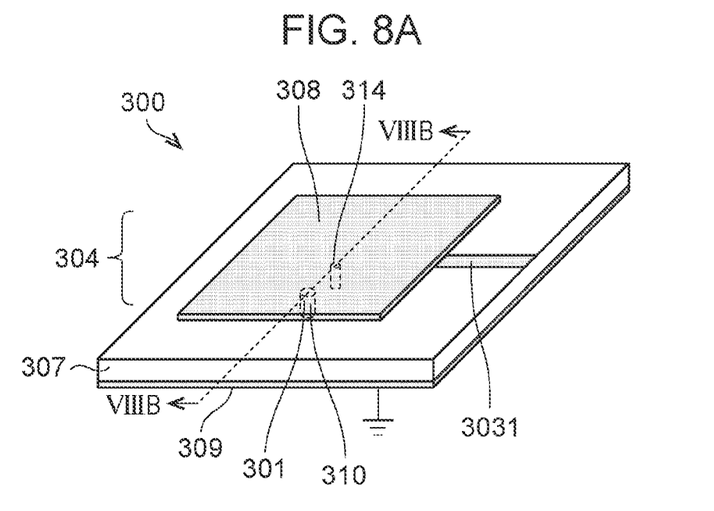
FIGS. 8A and 8B are explanatory views illustrating a configuration of an oscillator of EXAMPLE 2.
Figure 8B:
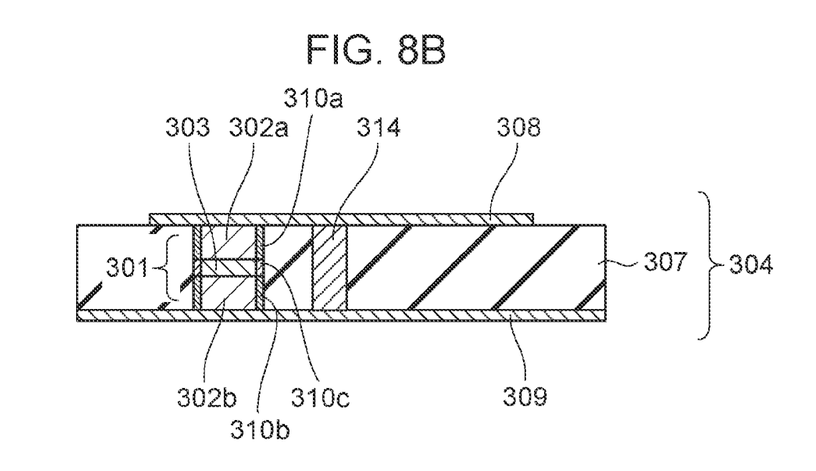

FIG. 8A is a perspective view of the oscillator 300, and FIG. 8B is a sectional view of the oscillator 300 taken along VIIIB-VIIIB in FIG. 8A.

EXAMPLE 2 represents an example in which a resistive element 314 is disposed inside a patch antenna 304. The resistive element 314 is disposed as a parallel resistance that is arranged in parallel to a negative resistive element 301 at a position of the node of a high frequency electric field standing inside the patch antenna 304.

The resistive element 314 connects a conductor 308 and a grounding conductor 309 to provide 20Ω therebetween. As disclosed in the above-cited Japanese Patent Laid-Open No. 2014-199965, the resistive element 314 can suppress the parasitic oscillation attributable to the wiring structure.

EXAMPLE 2 further represents an example in which an oscillation frequency fosc is changed from that in EXAMPLE 1. The oscillator 300 is an oscillator configured to oscillate at the oscillation frequency fosc=0.60 THz, and the patch antenna 304 is constituted by using, as a resonator, namely as the negative resistive element 301, a similar resonance tunneling diode (RTD) to that used in EXAMPLE 1.

The resonance tunneling diode (RTD) is formed in a diameter of 3 μm, and an amorphous layer 310 is formed in a thickness of 200 nm around the resonance tunneling diode. Moreover, a height of a mesa structure of the negative resistive element 301 is set to 200 nm. Description of other same structures as those in EXAMPLE 1 is omitted.

The patch antenna 304 is a square patch with each side (L) of 150 μm, and the conductor 308 is connected to a power supply (not illustrated) through one microstrip line 3031 with a width of 5 μm and a length of 38 μm. The BCB with a thickness of 3 μm is arranged as a dielectric 307 between the conductor 308 and the conductor 309. The RTD constituting the negative resistive element 301 with the diameter of 3 μm is connected between the conductors 308 and 309, and the negative resistive element 301 is arranged at a position shifted from a center of the conductor 308 by 60 μm in a resonance direction. A resonance frequency of the patch antenna 304 alone is about 0.8 THz, but the oscillation frequency lose of the oscillator 300 is about 0.60 THz in consideration of a reactance of the negative resistive element 301.

In the above-described configuration, a combined resistance of the doping layers 302a and 302b and the amorphous layers 310a and 310b is 0.1Ω or less at the oscillation frequency fosc=0.6 THz, but it is estimated to be 3 to 6Ω at a second harmonic (1.2 THz), Furthermore, the combined resistance is estimated to be 20 to 30Ω at a third harmonic (1.8 THz).

Moreover, as in EXAMPLE 1, the dielectric loss tangent (tan δ) when the amorphous layer 310c is present on the side wall is estimated to be about 5 times that when the amorphous layer 310c is not present. Thus, losses of the second and third harmonics are increased in comparison with a loss at the oscillation frequency fosc=0.6 THz, and the unwanted oscillations can be suppressed.

With the configuration of EXAMPLE 2, not only the second and third harmonics, but also the parasitic oscillation at a low frequency attributable to the wiring structure can be both suppressed in comparison with the oscillation at the oscillation frequency fosc=0.6 THz, and a stable oscillation at the desired oscillation frequency can be ensured.

Modifications

In the above, the triple barrier resonance tunneling diode made of InGaAs/InAlAs and InGaAs/AlAs and grown on the InP substrate has been described as the RTD. However, a semiconductor element constituting the negative resistive element in the present disclosure is not limited to the above-described structure and material and can also be provided by using suitable one of other structures and material combinations.

For example, a resonance tunneling diode of a double barrier quantum well structure or a resonance tunneling diode having quadruple or more multiple barrier quantum wells may also be used instead. The materials may be GaAs/AlGaAs, GaAs/AlAs, or InGaAs/GaAs/AlAs formed on a GaAs substrate. Alternatively, the materials may be InGaAs/AlGaAsSb formed on an InP substrate. The materials may be InAs/AlAsSb or InAs/AlSb formed on an InAs substrate. The materials may be SiGe/SiGe formed on a Si substrate.

Additionally, the materials may be given by a combination of at least parts of the above-mentioned examples. Thus, the structure and the materials may be selected as appropriate depending on the desired frequency and so on.

While this Specification is described on an assumption that carriers are electrons, the present disclosure is not limited to that case, and holes may be used as the carriers.

Materials of the substrate and the dielectric may be selected depending on applications and may be selected from semiconductors such as silicon, gallium arsenic, indium arsenic, and gallium phosphorus, glasses, ceramics, and resins such as Teflon (registered trademark) and polyethylene terephthalate.

Furthermore, the above-described embodiments and EXAMPLES can be, for example, replaced or combined with each other.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2020-181147, filed Oct. 29, 2020, which is hereby incorporated by reference herein in its entirety.

What is claimed is:

1. An oscillator oscillating a tera hertz wave, the oscillator comprising: a negative resistive element including a first semiconductor layer, a second semiconductor layer, and an active layer disposed between the first semiconductor layer and the second semiconductor layer; and a resonator including a first conductor, a second conductor, and a dielectric disposed between the first conductor and the second conductor, wherein the negative resistive element is disposed between the first conductor and the second conductor, a layer is disposed between the negative resistive element and the dielectric, the layer is a layer with a higher resistivity than the first semiconductor layer or the second semiconductor layer, the first semiconductor layer, the active layer, and the second semiconductor layer are laminated in a first direction, and the layer has a film thickness of 1 nm or more and 500 nm or less in a second direction orthogonal to the first direction.

2. The oscillator according to claim 1, wherein the layer is an amorphous layer.

3. The oscillator according to claim 1, wherein the layer contains an element forming the negative resistive element.

4. The oscillator according to claim 1, wherein the negative resistive element is surrounded by the dielectric.

5. The oscillator according to claim 1, wherein the negative resistive element has a mesa structure, and the layer is disposed on a side wall of the mesa structure.

6. The oscillator according to claim 1, wherein the layer includes a first layer disposed between the first semiconductor layer and the dielectric or between the second semiconductor layer and the dielectric, and a second layer disposed between the active layer and the dielectric.

7. The oscillator according to claim 1, wherein an element contained in the layer is one of In, Ga, As, and P.

8. The oscillator according to claim 1, wherein the resonator is a microstrip resonator including a patch antenna.

9. An oscillator oscillating a tera hertz wave, the oscillator comprising: a negative resistive element including a first semiconductor layer, a second semiconductor layer, and an active layer disposed between the first semiconductor layer and the second semiconductor layer; and a resonator including a first conductor, a second conductor, and a dielectric disposed between the first conductor and the second conductor, wherein the negative resistive element is disposed between the first conductor and the second conductor, a layer is disposed between the negative resistive element and the dielectric, the layer is an amorphous layer the first semiconductor layer, the active layer, and the second semiconductor layer are laminated in a first direction, and the layer has a film thickness of 1 nm or more and 500 nm or less in a second direction orthogonal to the first direction.

10. The oscillator according to claim 9, wherein the layer has a higher resistivity than the first semiconductor layer or the second semiconductor layer.

11. The oscillator according to claim 9, wherein the layer contains an element forming the negative resistive element.

12. The oscillator according to claim 9, wherein the negative resistive element is surrounded by the dielectric.

13. The oscillator according to claim 9, wherein the negative resistive element has a mesa structure, and the layer is disposed on a side wall of the mesa structure.

14. The oscillator according to claim 1, wherein the layer has a film thickness of 5 nm or more and 200 nm or less in the second direction.

15. The oscillator according to claim 9, wherein the layer has a film thickness of 5 nm or more and 200 nm or less in the second direction.

16. The oscillator according to claim 6, wherein the first layer has a lower impedance than the second layer at an oscillation frequency of the oscillator.

17. The oscillator according to claim 14, wherein the layer contains an element forming the negative resistive element.

18. The oscillator according to claim 9, wherein an element contained in the layer is one of In, Ga, As, and P.

* * * * *